United States Patent [19]

Vallancourt et al.

[11] Patent Number: 5,572,153
[45] Date of Patent: Nov. 5, 1996

[54] LOW OFFSET COMPARATORS BASED ON CURRENT COPIERS

[75] Inventors: David G. Vallancourt, Macungie, Pa.; Thayamkulangara R. Viswanathan, Addison, Tex.

[73] Assignee: Lucent Technologies Inc., Murray Hill, N.J.

[21] Appl. No.: 398,487

[22] Filed: Mar. 3, 1995

[51] Int. Cl.⁶ .......................... H03K 5/153; H03M 1/00
[52] U.S. Cl. ............................ 327/77; 327/96; 327/103; 341/136
[58] Field of Search ........................ 327/95, 94, 93, 327/91, 307, 103, 298, 77, 78, 81, 89, 56, 94, 103, 96; 365/900; 341/136

[56] References Cited

U.S. PATENT DOCUMENTS

| | | | |
|---|---|---|---|
| 4,560,890 | 12/1985 | Masuda et al. | 307/355 |
| 4,591,830 | 5/1986 | Hanna | 340/347 AD |
| 4,603,267 | 7/1986 | Kowallek | 307/362 |
| 4,697,152 | 9/1987 | Westwick | 330/9 |
| 4,710,724 | 12/1987 | Connell et al. | 327/89 |
| 4,748,418 | 5/1988 | Kerth | 330/9 |
| 4,910,518 | 3/1990 | Kim et al. | 341/155 |
| 4,989,003 | 1/1991 | Sauer | 341/136 |
| 4,996,529 | 2/1991 | Connell | 341/118 |
| 5,070,259 | 12/1991 | Rempfer et al. | 307/350 |
| 5,124,704 | 6/1992 | Kase et al. | 341/120 |
| 5,140,186 | 8/1992 | Ito et al. | 307/350 |
| 5,140,326 | 8/1992 | Bacrania et al. | 341/159 |
| 5,148,054 | 9/1992 | Demler | 307/352 |
| 5,164,726 | 11/1992 | Bernstein et al. | 341/120 |
| 5,173,698 | 12/1992 | Gulczynski | 341/158 |
| 5,194,866 | 3/1993 | Imaizumi et al. | 341/156 |
| 5,194,867 | 3/1993 | Fisher | 341/159 |
| 5,214,430 | 5/1993 | Gulczynski | 341/120 |
| 5,258,664 | 11/1993 | White | 327/91 |
| 5,262,685 | 11/1993 | Demler et al. | 307/353 |
| 5,276,521 | 1/1994 | Mori | 358/213.31 |
| 5,281,805 | 1/1994 | Sauer | 250/214 R |
| 5,291,198 | 3/1994 | Dingwall et al. | 341/159 |
| 5,296,752 | 3/1994 | Groeneveld et al. | 327/91 |
| 5,311,085 | 5/1994 | Pelgrom et al. | 307/494 |
| 5,319,266 | 6/1994 | Chu et al. | 307/494 |
| 5,332,931 | 7/1994 | Crispie et al. | 307/355 |
| 5,336,945 | 8/1994 | Ikeda | 307/355 |
| 5,349,245 | 9/1994 | Hughes et al. | 327/91 |
| 5,355,135 | 10/1994 | Redfern | 341/156 |

OTHER PUBLICATIONS

S. J. Daubert et al., "Current Copier Cells", Electronics Letters, vol. 24, No. 25, Dec. 1988, pp. 1560–1562.

Primary Examiner—Timothy P. Callahan
Assistant Examiner—Terry L. Englund

[57] ABSTRACT

The offset associated with mismatch of a pair of input devices in comparators used in applications such as flash converters is eliminated by using only one input device or transconductance circuit, time-shared between the input and reference signals. The input device converts each signal in succession into a current. A current copier stores one of these currents while the input device produces the other current, and the two currents are then compared by connecting them to a common node. The comparator includes a first switch for switching between an input and reference nodes, and an input device which receives a reference signal from the reference node during a first comparison cycle, receives an input signal from the input node during a second comparison cycle, and converts the input signal and the reference signal to input and reference currents, respectively. A current copier stores the reference current during the first comparison cycle, and generates a comparison signal from the stored reference current and the input current during the second comparison cycle.

15 Claims, 7 Drawing Sheets

LOW OFFSET COMPARATORS BASED ON CURRENT COPIERS

BACKGROUND OF THE INVENTION

1. Field of the Invention

This disclosure relates generally to comparators, and in particular, to comparators and circuits based on current copiers.

2. Description of the Related Art

In some comparators such as a standard differential pair comparator, input device threshold mismatch and transconductive parameter mismatch causes voltage offsets. Comparators using current mirrors have such voltage offsets, since current mirror load contributes to offset and must be adjusted for accurate operation. Offset voltages are often stored on capacitors and subsequently subtracted from input signals to adjust for the offset. The storage and subtraction process may be slow, since comparators are generally placed in a closed feedback loop arrangement during the offset cancellation process. In use with analog-to-digital (A/D) and digital-to-analog (D/A) converters, such slow adjustment for offset limits the speed of the conversion process.

In some comparator circuits which adjust for offset effects, currents may be stored so as to be proportional to a reference, with an input signal being fed to an input device, and clock feedthrough suppressed. However, such comparators are also subject to such slow adjustment of offset. Offset adjustment is also required for other circuits such as flash converters and the like. It would be advantageous to reduce or cancel offset effects as well as increase comparison processing speed without closed loop calibration and without direct switch charge injection at the input of the comparator.

SUMMARY

An integrated circuit including a comparator having reduced offset and based on current copiers is disclosed, including an input node; a reference node; an input device for receiving a reference signal from the reference node during a first comparison cycle, for receiving an input signal from the input node during a second comparison cycle, and for converting the input signal and the reference signal to an input current and a reference current, respectively; and a current copier for storing the reference current during the first comparison cycle, and for generating a comparison signal from the stored reference current and the input current during the second comparison cycle.

The current copier may include a switch for closing during the first comparison cycle; and a transistor which responds to the closing of the switch for storing the reference current during the first comparison cycle. An adjustment circuit, coupled to the input device and the current copier, is included for generating an approximation current as a first portion of the reference current; and the current copier responds to the approximation current to storing a second portion of the reference current to reduce an offset in the generation of the comparison signal.

An amplifier may be included for enhancing a gain associated with the generation of the comparison signal. The amplifier may include a plurality of transistors in a cascode arrangement between the input device and the current copier to enhance the gain. The comparison functional output is produced at the node connecting the input device and current copier. The voltage at this node rises when the current stored in the current copier is larger than that generated by the input device, if no other path for charge flow exists at this node.

An improved flash converter is also disclosed using the disclosed comparators.

BRIEF DESCRIPTION OF THE DRAWINGS

The features of the disclosed low offset comparators and flash converters and method of operation based on current copiers will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 1:
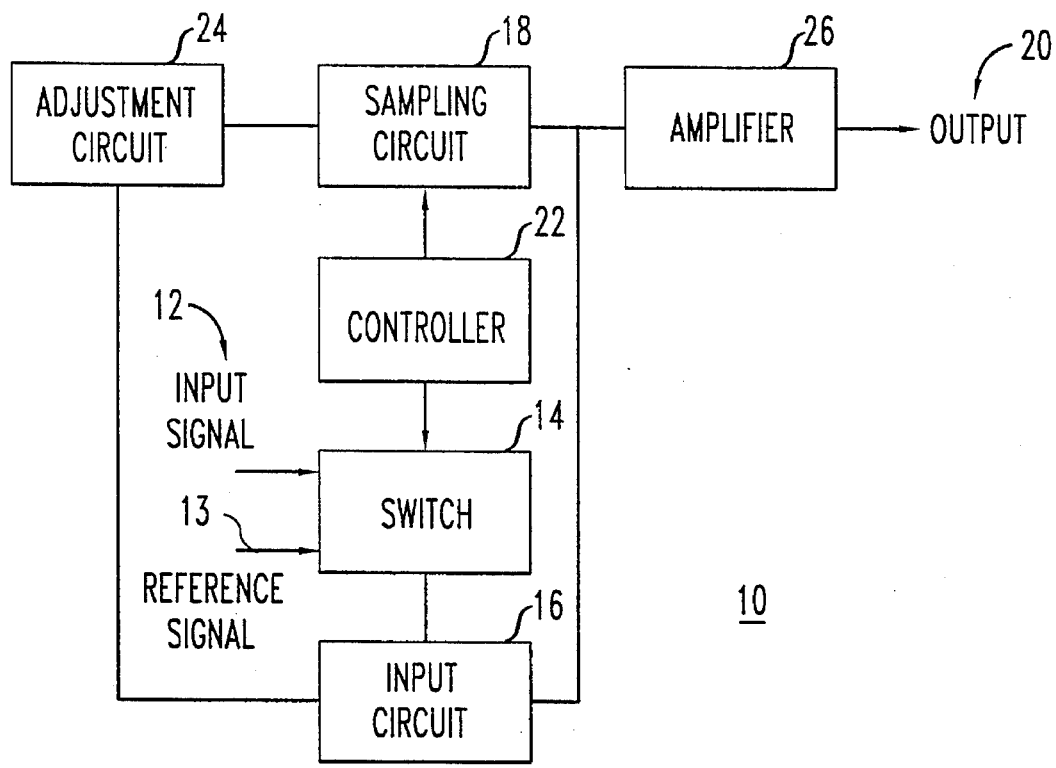
FIG. 1 illustrates a block diagram of the disclosed comparator.

Referring now in specific detail to the drawings, with like reference numerals identifying similar or identical elements, as shown in FIG. 1, the present disclosure describes low offset comparators and flash converters based on current copiers. In these disclosed devices, the offset associated with mismatch of input devices in a comparator is eliminated by using only one input device which is time-shared between the two input signals. The input device converts each signal in succession into a current. A current copier stores one of these signals while the input device produces the other signal, and the two currents are then compared.

To compensate for offset, the comparator of the present disclosure uses a single input device, switched between the input signal and a reference, and a similarly switched sampling circuit. In an exemplary embodiment, as shown in FIG. 1, the comparator 10 receives an input signal 12 and a reference signal 13 which are switched by switch 14 to an input device or circuit 16. This circuitry is typically incorporated in an integrated circuit (IC). The input device 16 converts the signals 12, 13 to a current which is stored by a sampling circuit 18 operatively connected to the input device 16. In operation, the comparator 10 uses the switch 14, the input device 16, and the sampling circuit 18 to generate an output 20 as the comparison signal of the input signal 12 with the reference signal 13. The comparator 10 may include or may be operatively connected to a controller 22 for controlling the switch 14 and the sampling circuit 18. Such a controller 22 may be incorporated in a control mechanism of an integrated circuit including or connected to the comparator 10 in a manner known in the art.

The comparator 10 of FIG. 1 may optionally include an adjustment circuit 24 connected to the input device 16 and the sampling circuit 18 to approximate a reference signal to improve the adjustment for offset by the comparator 10. The comparator 10 may also include an amplifier 26 to enhance gain during a comparison phase.

Figure 2:
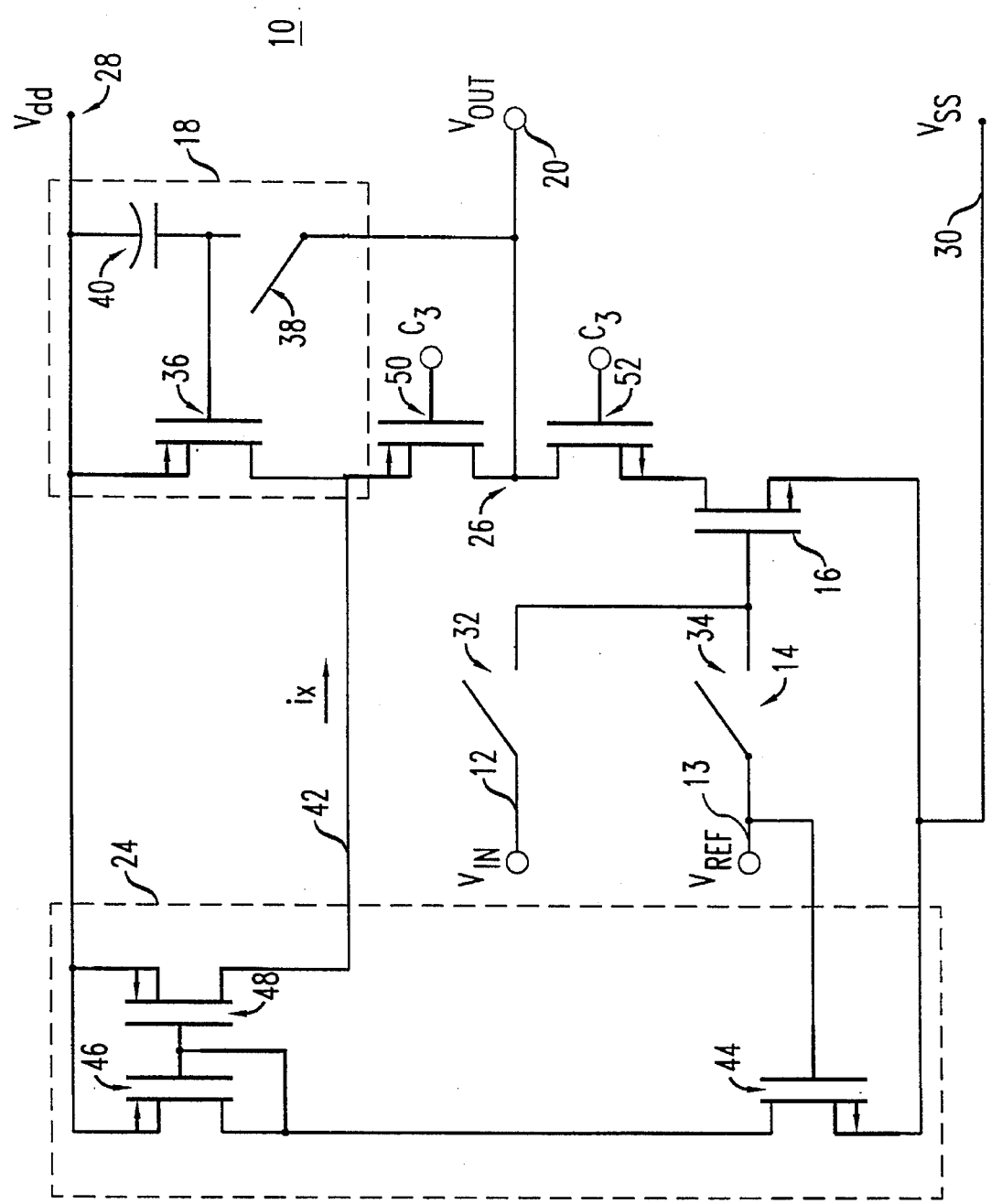
FIG. 2 illustrates an exemplary circuit of the disclosed comparator.

In the exemplary embodiment of the comparator 10 shown in FIG. 2, the comparator 10 receives an input voltage $V_{IN}$ as input signal 12 and a reference voltage $V_{REF}$ as reference signal 13 for comparison. The signals 12, 13 are switched by switches 32, 34, respectively, of switch 14. Such switches 32, 34 may be embodied as transistors such as metal oxide semiconductor field effect transistors (MOSFETs) which respond to clocking pulses to drive the input device 16. It is understood that other types of transistors and equivalent circuits may be employed in a manner known in the art.

The switched signals 12, 13 are applied to the input device 16 which may be, for example, a MOSFET operatively connected to a drain voltage $V_{dd}$ 28 and a source voltage $V_{ss}$ 30. The input device 16 is operatively connected to the sampling circuit 18 and the output 20. In an exemplary embodiment, the sampling circuit 18 is a current copier, as described in S. J. Daubert et al., "Current Copier Cells", ELECTRONICS LETTERS, VOL. 24, NO. 25, Dec. 1988, pp. 1560–1562. The current copier 18 includes a MOSFET 36 and a switch 38. In the exemplary embodiment, the gate capacitance of the MOSFET 36 is sufficient for operation of the current copier 18; otherwise, a capacitor 40 may be provided in the current copier 18.

The devices 50, 52, if present, enhance the performance in a manner to be described. If not present, that is, with a short circuit replacing the drain to source path of each, the comparator 10 still operates.

Figure 3:
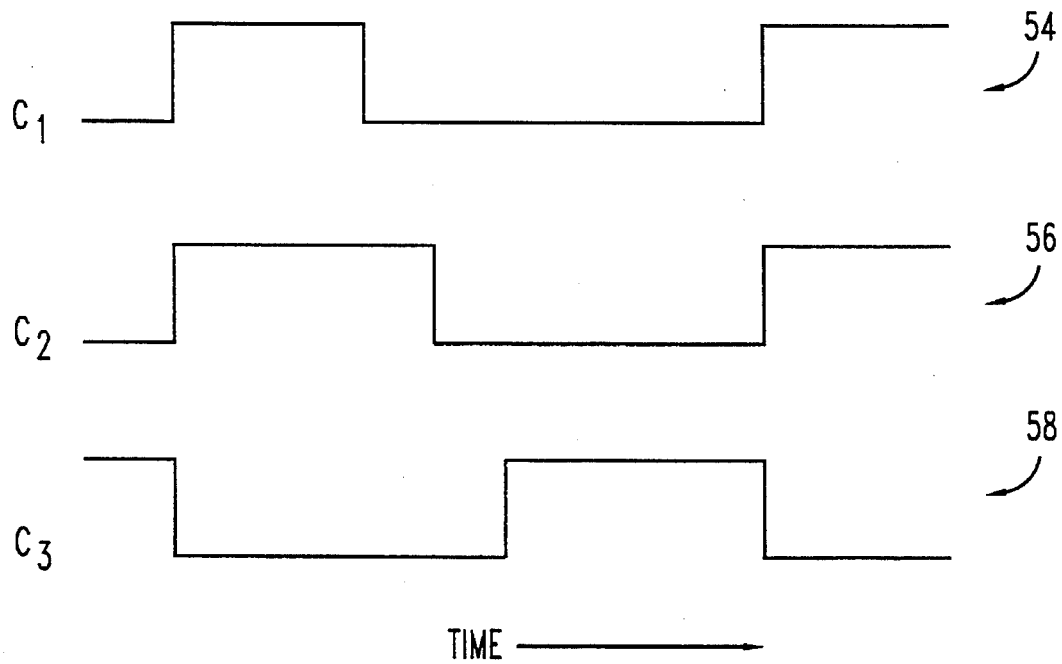
FIG. 3 illustrates clock pulse signals.

In operation, the controller 22 or, alternatively, an independent clock source, provides clocking pulses to switches 32, 34, 38, as illustrated in FIG. 3. The switch 38 of the current copier 18 receives pulse 54, labelled $C_1$, while switches 34, 32 receive pulses 56, 58, respectively, which are labelled $C_2$, $C_3$, respectively. In particular, when a pulse is high or active, the corresponding switch is closed (i.e. conducting).

When $C_1$ and $C_2$ are active, i.e. switches 38, 34, respectively, are closed, the input device 16 generates a current flowing through MOSFET 36 approximately given by $$I_{REF} = k_1 \left( \frac{W}{L} \right)_1 (V_{REF} - V_{T1})^2 \quad (1)$$

where k is a constant, and W and L are the width and length of the channel, respectively, and $V_{T1}$ is the threshold voltage of the MOSFET. When $C_1$ goes low, the gate voltage of the MOSFET 36 corresponding to the above current is stored by the capacitor 40. Switch 32 may then be opened; i.e. when $C_2$ goes low.

When $C_3$ goes high while $C_1$ is low, as in FIG. 3, the input device 16 generates a current having magnitude $$I_{IN} = k_1 \left( \frac{W}{L} \right)_1 (V_{IN} - V_{T1})^2 \quad (2)$$

The two currents from the input device 16 and the MOSFET 36 are thus in conflict, and the voltage at the output 20 indicates which of these two currents is larger. If the reference voltage $V_{REF}$ is higher than the input voltage $V_{IN}$, the output voltage rises and is interpreted as a logic decision.

Both of the compared currents are generated successively by the same input device 16, and so $k_1 W/L$ and $V_{T1}$ cancel. When the comparator 10 is operated fast enough to allow junction leakage to be neglected, the comparator 10 suffers no significant source of offset other than that created by switch 38.

Feedthrough from switch 38 of the current copier 18 introduces an error in the current stored in the current copier 18. The drain current of MOSFET 36 is:

$$I_2 = \beta_2 (V_{sg2} - V_{t2})^2 \quad (3)$$

and the drain current of the input device 16 is:

$$I_1 = \beta_1 (V_{sg1} - V_{T1})^2 \quad (4)$$

The charge feedthrough of switch 38 results in a change in the source-gate voltage of MOSFET 36 equal to $\Delta V$, resulting in an offset which may be calculated as:

$$V_{OFFSET} = \Delta V \sqrt{\frac{\beta_2}{\beta_1}} \quad (5)$$

which is input-referred.

In the disclosed comparator 10, offset is minimized by minimizing the ratio $\beta_2/\beta_1$ by adjusting the parameters W and L of the input device 16 and the MOSFET 36.

In an alternative embodiment, to avoid excessive $V_{sg2}$, an adjustment circuit 24 may be included, as shown in FIG. 2. The adjustment circuit 24 is operatively connected to the input device 16, the current copier 18, and the output 20 by connection 42. The adjustment circuit 24 includes a MOSFET 44 coupled to the $V_{REF}$, and a pair of MOSFETs 46, 48, with the drain of MOSFET 48 operatively connected to the input device 16, the sampling circuit 18, and the output 20. The adjustment circuit 24 operates such that the current $i_x$ flowing through connection 42 from MOSFET 48 is an approximation of the current $I_{REF}$, and the MOSFET 36 carries the remainder; i.e. $I_{REF} - i_x$. The adjustment circuit 24 does not provide an additional source of offset when $i_x$ is less than $I_{REF}$. If $i_x$ is a large fraction of $I_{REF}$, the parameters of the input device 16 and MOSFET 36 may be determined to minimize $\beta_2/\beta_1$. In this exemplary embodiment, the comparator 10, including the adjustment circuit 24 shown in FIG. 2, does not have the same drain currents at the input device 16 and the MOSFET 36, so the offset voltage is:

$$V_{OFFSET} = \Delta V \frac{g_{m_2}}{g_{m_1}} \quad (6)$$

Therefore, both of the factors:

$$\sqrt{\frac{\beta_2}{\beta_1}} \text{ and } \sqrt{\frac{I_{d_2}}{I_{d_1}}} \quad (7)$$

contribute to the reduction in offset by the current copier using switch 38.

In the above exemplary embodiments, the source of the input device 16 and the MOSFET 44 of the adjustment circuit are connected to the common source voltage $V_{ss}$ 30. In another exemplary embodiment, bias conditions may be established by including a source of bias current between the sources of MOSFETs 16, 44 and $V_{ss}$ to provide a tail current $I_{BIAS}$. The tail current $I_{BIAS}$ allows for independent control of $V_{REF}$ and $I_{REF}$ with no additional offset effects. When so included, the equations (1)–(2) are modified, but equations (5)–(7) remain valid.

In alternative embodiment to the comparator 10 in FIG. 2 including the adjustment circuit 24, the current copier 18 may be a bidirectional current copier, which does not require that $i_x$ is less than $I_{REF}$.

Other gain-enhancement techniques known in the art may be employed as the amplifier 26 to increase amplification during the comparison stage; i.e. when $C_3$ is high. In an exemplary embodiment shown in FIG. 2, the amplifier 26 is a pair of MOSFETs 50, 52 forming a cascode circuit, with the output 20 connected to the sources of MOSFETs 50, 52, and the sources of the input device 16 and the MOSFET 36 connected to the drains of MOSFETs 50, 52, respectively.

Figure 4:
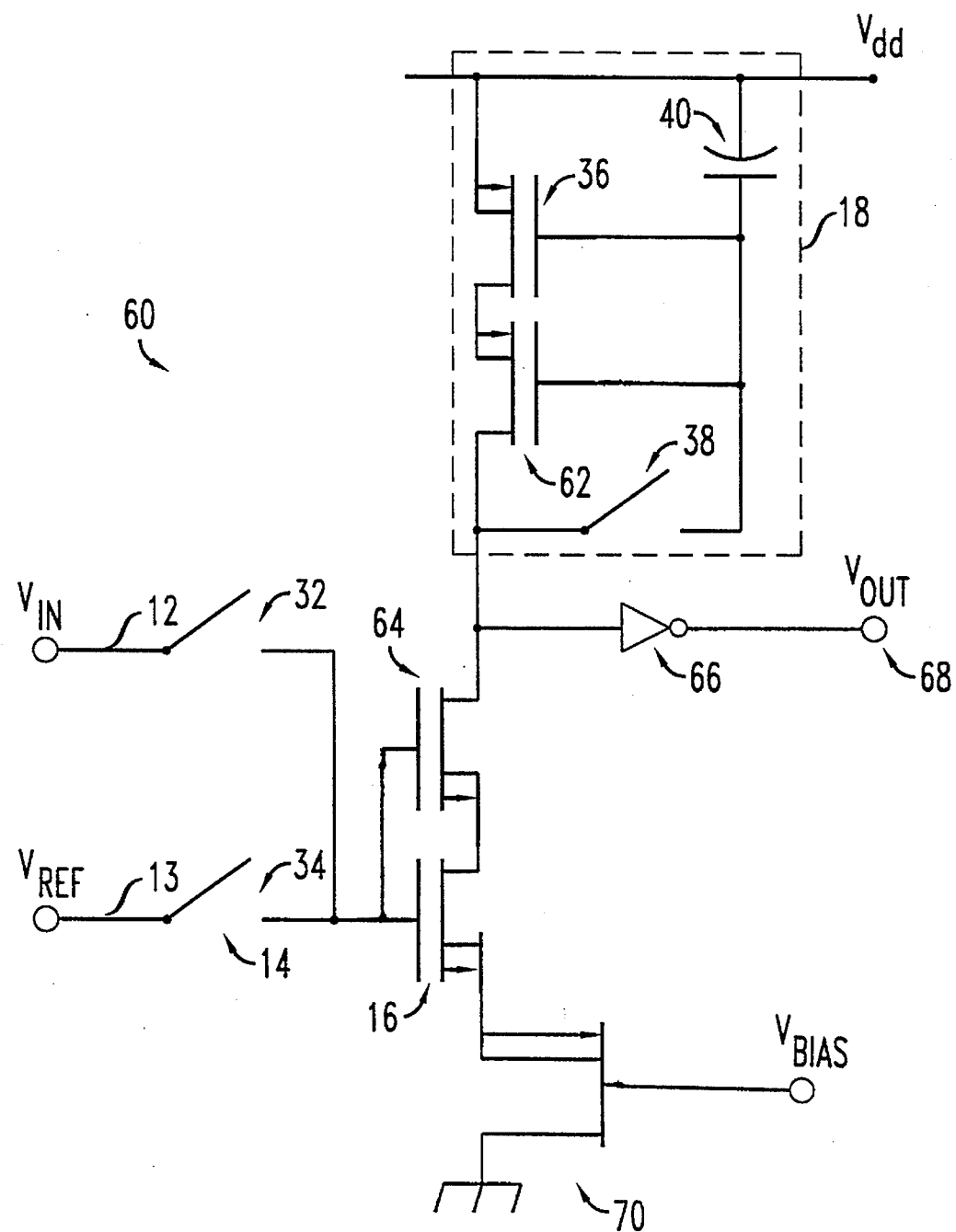
FIG. 4 illustrates an inverter.

In another alternative embodiment shown in FIG. 4, a comparator circuit 60 employs the arrangement of a current copier 18 and switched inputs with switches 32, 34, 38 as described above for reducing offset, as well as a cascode arrangement of MOSFETs 62, 64 for gain enhancement. Input device 16 and MOSFET 36 perform an inverter function, and another inverter 66 connects the cascode arrangement to the output 68. In an exemplary embodiment, the MOSFETs 62, 64 are low threshold devices, but alternatively the gate of MOSFET 64 may be connected to an independent bias voltage source. MOSFET 70 provides means by which the reference current may be controlled, in a manner to be described in conjunction with the circuit shown in FIG. 5.

As described above in conjunction with FIG. 3, as switches 34, 38 close, the gates of the n-channel MOSFETs 16, 64 are connected to the reference voltage $V_{REF}$ and the current is copied to MOSFETs 36, 62 in the current copier 18. The inverter 66 buffers the output. As switch 32 closes, the input signal $V_{IN}$ is connected to the gates of MOSFETs 16, 64, and the load at the output 68 retrieves the copied current stored in the current copier 18. A comparison of $V_{IN}$ with $V_{REF}$ is then made with reduced offset. As the magnitude of $V_{REF}$ increases the current stored may become excessive. The p-channel device 70 with its gate connected to $V_{BIAS}$ enables this current to be controlled.

Figure 5:
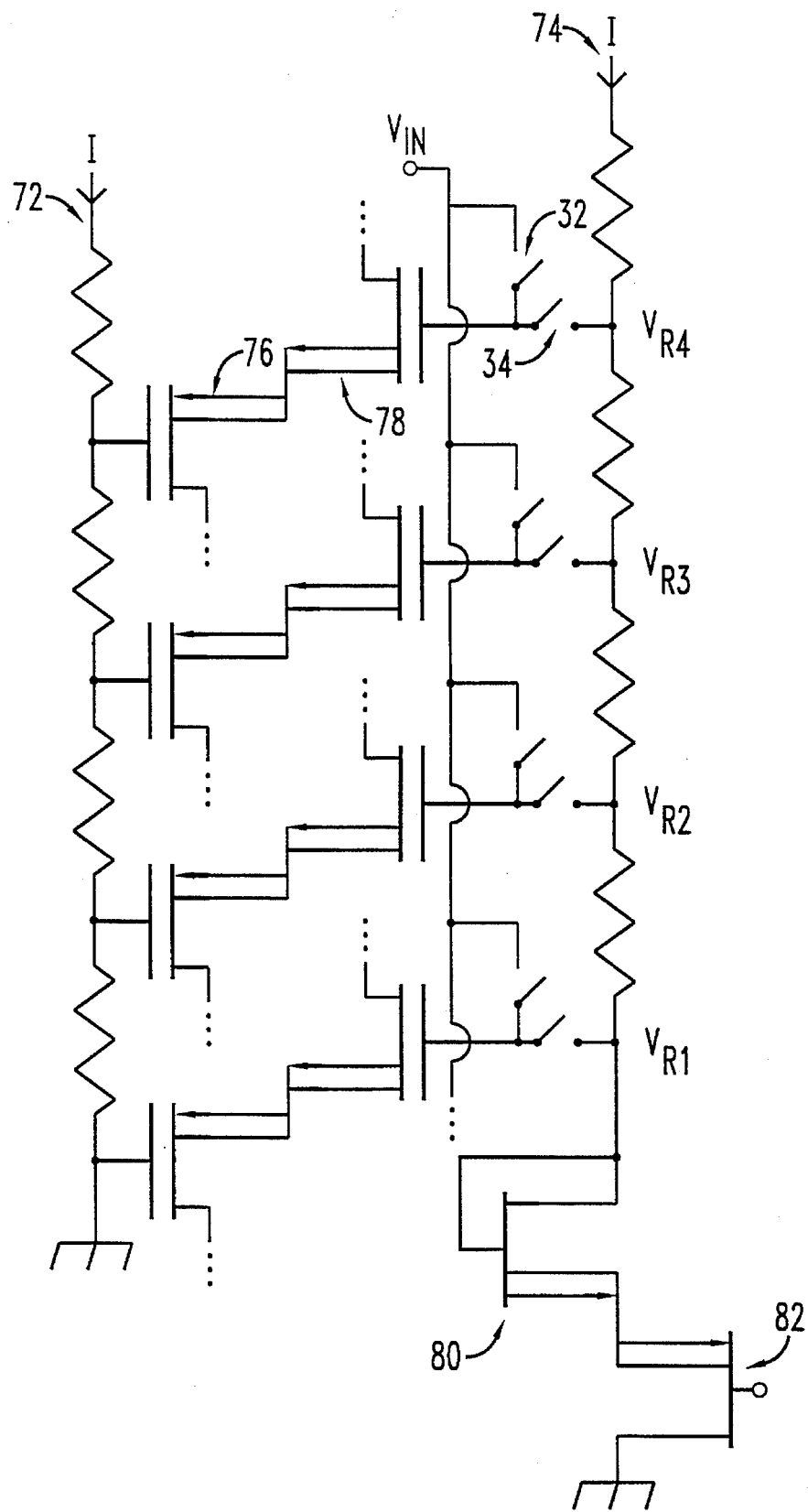
FIG. 5 illustrates resistor strings of a flash converter.

The disclosed use of current copiers and switched input signals to reduce offset has further applications. For example, in a flash converter $2^N$ comparators are used to obtain n-bits of resolution, and the comparators should be simple and fast. As shown in FIG. 5, flash converters use strings 72, 74 of resistors to produce multiple reference levels as reference voltages $V_{R1}$, $V_{R2}$, $V_{R3}$, $V_{R4}$. Such resistor strings cause variation in a copied current over a wide range of current values, especially as the current is related to the square law characteristics of the MOSFETs.

The variations of current may be avoided using complementary metal oxide semiconductors (CMOS), such as a series combination of a pair of complementary devices 76, 78 as shown in FIG. 5. In the exemplary embodiment, two resistor strings 72, 74 are used which are current biased, and MOSFETs 80, 82 provide that the currents in the input devices of each comparator in the flash converter are approximately the same within a matching accuracy. The pairs 76, 78 of FIG. 5 may then be used as the input device including MOSFETs 16, 70 in FIG. 4 to operatively connect multiple comparators embodied in FIG. 4 as a flash converter.

Figure 6:
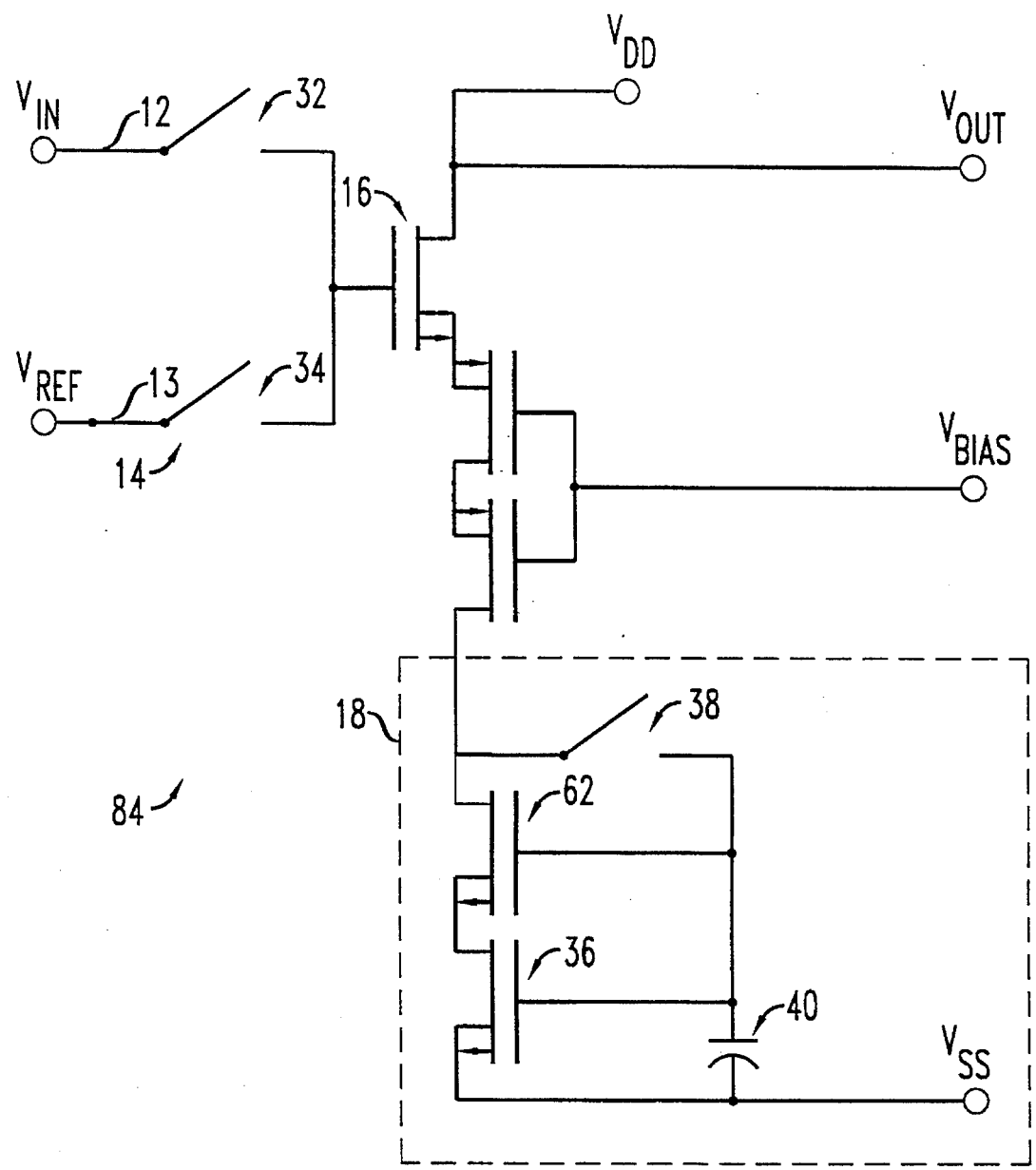
FIG. 6 illustrates an alternative embodiment of a comparator.

For comparators connected to, for example, a first resistor string 72, low threshold devices are not essential for cascoding since a second resistor string 74 is available for biasing the cascode devices. Taps from the second resistor string 74 may be used to obtain cascode bias voltages. In a further alternative embodiment, the comparator 84 in FIG. 6 provides complementary loading, so it may be used for higher reference level values of $V_{REF}$ approaching $V_{dd}$ in FIG. 5.

Figure 7:
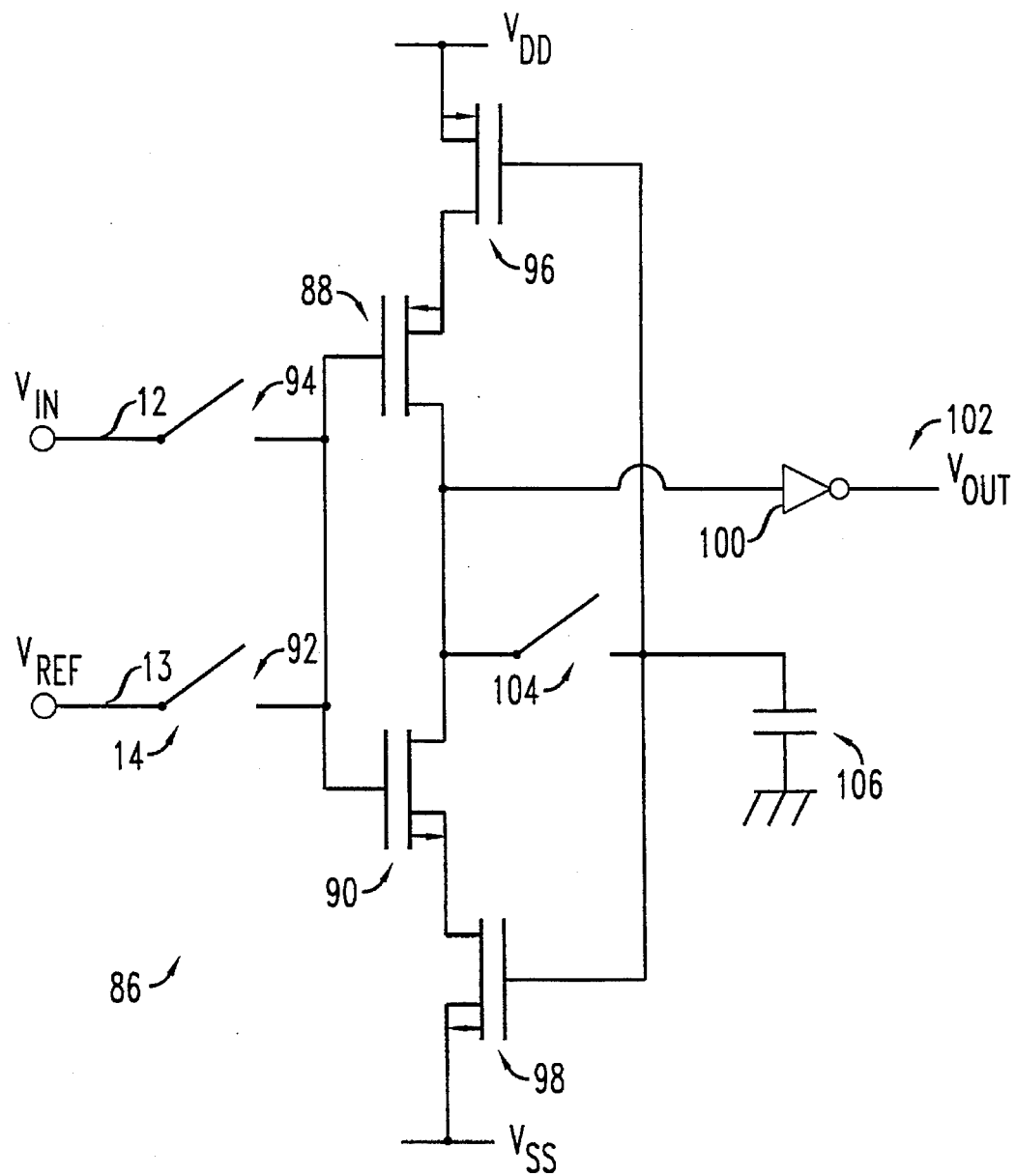
FIG. 7 illustrates a variable threshold inverter.

In another alternative embodiment, as illustrated in FIG. 7, a class AB push-pull version 86 of the current copying comparator is disclosed. With both of switches 92, 104 closed, transistors 90, 96 perform the equivalent function of transistors 16, 36, respectively, in FIG. 6. At the same time, complementary transistors 88, 98 perform the same function. When switch 94 is closed, the comparison occurs and an output is obtained at output node 102 through the inverter 100 as a buffer. An optional capacitor 106 may be included, as shown in FIG. 7.

Figure 8:
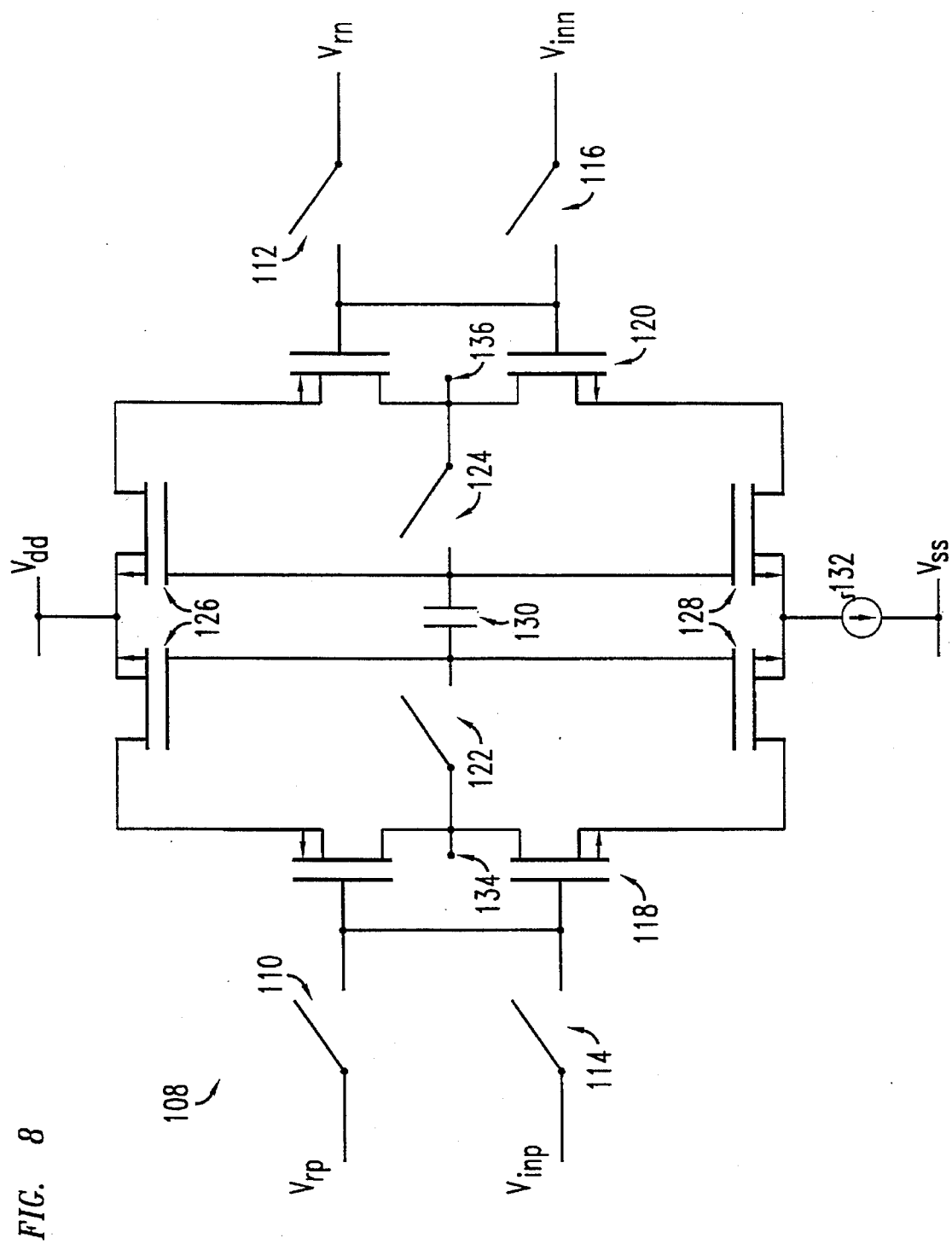
FIG. 8 illustrates a differential comparator.

In a further alternative embodiment, a differential comparator 108 having low offset is shown in FIG. 8 which connects reference voltages $V_{rp}$, $V_{rn}$ (positive and negative, respectively), and input voltages $V_{inp}$, $V_{inn}$ (positive and negative) to switches 110–116, respectively, where switches 110, 112 are clocked by pulse $C_2$ in FIG. 3, and switches 114, 116 are clocked by pulse $C_3$. Switches 110–116 are connected to input devices 118, 120, to current copiers including switches 122, 124 which are clocked by pulse $C_1$, and MOSFETs 126, 128, with an optional capacitor 130 and current bias 132. Output nodes 134, 136 are positive and negative outputs of the differential comparator 108.

While the disclosed low offset comparator and method have been particularly shown and described with reference to the preferred embodiments, it is understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. An integrated circuit (IC) including a comparator comprising:

an input node;

a reference node;

an output node;

an input device for receiving a reference signal from the reference node during a first comparison cycle, for receiving an input signal from the input node during a second comparison cycle, for converting the input signal and the reference signal to an input current and a reference current, respectively, and for outputting the input current and the reference current to the output node;

an adjustment circuit, coupled to the output node and responsive to the reference signal, for generating an approximation current at the output node; and a current copier for storing the reference current as a corresponding first stored voltage during the first comparison cycle, and responsive to the approximation current at the output node for generating a comparison signal at the output node from the first stored voltage, the approximation current, and the input current during a third comparison cycle.

2. The integrated circuit of claim 1 wherein the current copier includes:

a switch for closing during the first comparison cycle; and a transistor, responsive to the closing of the switch, for storing the first stored voltage during the first comparison cycle.

3. The integrated circuit of claim 1 further including:

the adjustment circuit, coupled to the input device and the current copier, for generating and outputting the approximation current at the output node as a first portion of the reference current; and the current copier, responsive to the approximation current at the output node, for storing a second portion of the reference current as a corresponding second stored voltage to reduce an offset in the generation of the comparison signal.

4. The integrated circuit of claim 1 further including:

an amplifier for amplifying a gain of the comparison signal.

5. The integrated circuit of claim 4 wherein the amplifier includes:

a plurality of transistors in a cascode arrangement between the input device and the current copier, responsive to a pulse signal during a comparison phase, to amplify the gain of the comparison signal.

6. The integrated circuit of claim 1 wherein the current copier generates the comparison signal being high using positive logic if the reference signal is greater than the input signal.

7. A comparator comprising:

a reference switch for connecting a reference node to an input device during a first comparison cycle;

an input switch for connecting an input node to the input device during a second comparison cycle;

an output node;

the input device including an input transistor having first, second, and third conductive elements, the input device for receiving a reference signal at the first conductive element from the reference node during a first comparison cycle, for receiving an input signal at the first conductive element from the input node during a second comparison cycle, and for converting the input signal and the reference signal to an input current and a reference current, respectively, the second conductive element connected to a first voltage node, and the third conductive element for outputting the input current and the reference current, respectively, to the output node;

an adjustment circuit, coupled to the output node and responsive to the reference signal, for generating an approximation current at the output node; and a current copier including:

a copier transistor having first, second, and third conductive elements, the first conductive element for connection through a copier switch to the output node, the second conductive element connected to a second voltage node, and the third conductive element connected to the third conductive element of the input transistor at the output node; and the copier switch for closing during the first comparison cycle and for opening during the second comparison cycle, the copier switch for connecting the first and third conductive elements of the copier transistor during the first comparison cycle for storing the reference current as a corresponding stored voltage, the copier transistor responsive to the opening of the copier switch to receive the input current, to generate a comparison signal at the output node, and to reduce an offset associated with the comparison signal from the stored voltage, the approximation current, and the input current during a third comparison cycle.

8. The comparator of claim 7 further including:

an amplifier having:

a first transistor for coupling the third conductive element of the copier transistor to the output node;

a second transistor in a cascode arrangement with the first transistor of the amplifier and for coupling the output node to the third conductive element of the input transistor; and wherein the first and second transistors of the amplifier respond to a control pulse and to a difference in an input voltage corresponding to the input current and the stored voltage for amplifying a gain of the comparison signal.

9. The comparator of claim 7 wherein the current copier generates the comparison signal being high using positive logic if the reference voltage is greater than an input voltage corresponding to the input signal, thereby generating an inverted signal of the input current as the comparison signal with reference to the reference current.

10. The comparator of claim 7 wherein:

the second comparison cycle occurs after the first comparison cycle; and the input device is time-shared between the reference signal and the input signal to convert each respective signal in succession to a corresponding current.

11. In a flash converter for converting an input signal, having a series of resistive elements for generating a plurality of reference voltages and having a plurality of comparators with each comparator associated with a respective reference voltage at respective reference nodes, each comparator comprises:

a first switch for switching between an input node and a reference node;

an input device for receiving the reference voltage from the respective reference node during a first comparison cycle, for receiving an input signal from the input node during a second comparison cycle, and for converting the input signal and the reference voltage to an input current and a reference current, respectively, at an output node;

an adjustment circuit, coupled to the output node and responsive to the reference voltage, for generating an approximation current at the output node; and a current copier for storing the reference current as a corresponding stored voltage during the first comparison cycle, and for generating a respective comparison signal at the output node from the stored voltage, the approximation current, and the input current during a third comparison cycle.

12. The flash converter of claim 11 wherein the input device of each comparator includes complementary metal oxide semiconductor (CMOS) transistors to reduce variation in copied reference currents.

13. A method for generating a comparison signal with reduced offset comprising the steps of:

receiving an input signal at an input node;

receiving a reference signal at a reference node;

receiving at an input device the reference signal from the reference node during a first comparison cycle;

generating a reference current from the reference signal;

generating an approximation current at an output node from the reference signal;

switching a copier switch during the first comparison cycle;

storing the reference current in a current copier as a corresponding stored voltage during the first comparison cycle;

receiving at the input device the input signal from the input node during a second comparison cycle;

generating at the input device an input current during the second comparison cycle; and generating a comparison signal from the stored voltage, the approximation current, and the input current during a third comparison cycle to reduce offset thereof.

14. An integrated circuit (IC) including a comparator comprising:

an input node;

a reference node;

an input device, including a MOSFET transistor, for receiving a reference signal at a gate of the MOSFET transistor from the reference node during a first comparison cycle, for receiving an input signal at the gate of the MOSFET transistor from the input node during a second comparison cycle, for converting the input signal and the reference signal to an input current and a reference current, respectively;

an adjustment circuit, responsive to the reference signal, for generating an approximation current;

a current copier for storing the reference current as a corresponding stored voltage during the first comparison cycle, and for generating a comparison signal from the stored voltage, the approximation current, and the input current during the third comparison cycle; and a cascode amplifier, including a plurality of transistors in a cascode arrangement between the input device and the current copier and responsive to a pulse signal during a third comparison cycle, for amplifying a gain of the comparison signal.

15. A comparator comprising:

a reference switch for connecting a reference node to an input device during a first comparison cycle;

an input switch for connecting an input node to the input device during a second comparison cycle;

an output node;

the input device including an input MOSFET transistor having a first, second, and third conductive element the input device for receiving a reference signal at the first conductive element from the reference node during a first comparison cycle, for receiving an input signal at the first conductive element from the input node during a second comparison cycle, and for converting the input signal and the reference signal to an input current and a reference current, respectively, the second conductive element connected to a first voltage node, and the third conductive element for outputting the input current and the reference current, respectively, to the output node;

an adjustment circuit, coupled to the output node and the reference node and responsive to the reference signal, for generating an approximation current at the output node;

a current copier including:

a copier transistor having a first, second, and third conductive element, the first conductive element for connection through a copier switch to the output node, the second conductive element connected to a second voltage node, and the third conductive element connected through a cascode amplifier circuit to the third conductive element of the input MOSFET transistor at the output node: and the copier switch for closing during the first comparison cycle and for opening during the second comparison cycle, the copier switch for connecting the first and third conductive elements of the copier transistor during the first comparison cycle for storing the reference current as a corresponding stored voltage, the copier transistor responsive to the opening of the copier switch to receive the input current, to generate a comparison signal at the output node, and to reduce an offset associated with the comparison signal from the stored voltage the approximation current, and the input current during the third comparison cycle; and the cascode amplifier circuit having:

a first transistor for coupling the third conductive element of the copier transistor to the output node;

a second transistor in a cascode arrangement with the first transistor of the amplifier and for coupling the output node to the third conductive element of the input MOSFET transistor; and wherein the first and second transistors of the amplifier respond to an input control pulse during a third comparison cycle and to a difference in an input voltage corresponding to the input current and the stored voltage for amplifying a gain of the comparison signal.

* * * * *